(12) United States Patent
Deeney (10) Patent No.: US 6,549,418 B1
(45) Date of Patent: Apr. 15, 2003

(54) LAND GRID ARRAY INTEGRATED CIRCUIT DEVICE MODULE

(75) Inventor: Jeffrey L. Deeney, Fort Collins, CO (US)

(73) Assignee: Hewlett Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/965,281

(22) Filed: Sep. 26, 2001

(51) Int. Cl.$^7$ .............................. H05K 1/00; H05K 7/12
(52) U.S. Cl. ..................... 361/736; 361/767; 361/768; 361/769; 361/787
(58) Field of Search ................................ 361/736, 719, 361/767–769, 783, 787, 789, 791, 800, 717; 174/52.1

(56) References Cited

U.S. PATENT DOCUMENTS

| | | | | |
|---|---|---|---|---|
| 5,473,510 A | * | 12/1995 | Dozier, II | 361/719 |
| 6,061,235 A | | 5/2000 | Cromwell et al. | 361/690 |
| 6,097,609 A | * | 8/2000 | Kabadi | 361/760 |
| 6,198,630 B1 | | 3/2001 | Cromwell | 361/704 |

* cited by examiner

Primary Examiner—David Martin
Assistant Examiner—Dameon E. Levi (57) ABSTRACT

An integrated circuit device module comprises a printed circuit board having opposed sides, the printed circuit board comprising a portion carrying an area contact array on one of the sides of the printed circuit board. The module comprises an integrated circuit device having opposed, top and bottom surfaces, the bottom surface of the integrated circuit device comprising an area contact array for electrical communication with the area contact array on the printed circuit board. The module further comprises a clamping mechanism for compressively urging the area contact array on the bottom surface of the integrated circuit device into electrical communication with the area contact array on the portion of the printed circuit board, the forces applied by the clamping mechanism tending to deflect the portion of the printed circuit board and cause the area contact array on the bottom surface of the integrated circuit device to lose electrical communication with the area contact array on the integrated circuit device. A biasing structure is coupled to the printed circuit board for counteracting the forces applied by the clamping mechanism and the resulting tendency of the portion of the printed circuit board to deflect.

11 Claims, 5 Drawing Sheets

LAND GRID ARRAY INTEGRATED CIRCUIT DEVICE MODULE

BACKGROUND OF THE INVENTION

1. Field of the Invention

The present invention relates generally to integrated circuit device packaging. More particularly, the present invention relates to land grid array (LGA) integrated circuit (IC) device modules.

2. Description of the Related Art

In one known area array IC device packaging and interconnection technique, called land grid array (LGA), electrical connection is established and maintained through pad-to-pad contact by clamping the IC device to a higher assembly such as a printed circuit board through an intervening LGA interposer socket having an array of compliant contacts. LGA technology provides high density, small footprint, low profile IC device interconnections with low inductance for high speed applications. LGA devices avoid thermal mismatch problems, cost less to manufacture and to assemble and can be easily removed and replaced.

In the case of a high density IC device having, for example, 1,089 contacts, the clamping load applied to the top of the IC device may be as high as 300 pounds. Because such IC devices also dissipate a significant amount of heat, a heat sink is required. Attachment of these heat sinks also requires a mechanical load to be applied to the top of the IC device. This mechanical load ensures a low thermal resistance between the IC device and the heat sink and also ensures that the heat sink will remain in place under shock and vibration conditions.

Because of the high clamping loads involved, the relative flexibility of the printed circuit board to which the IC device is electrically connected and the limited ability of the intervening LGA sockets to mate with nonplanar components, a stiffening or backing plate, typically of steel or aluminum, is disposed under the printed circuit board on the side opposite the IC device to provide sufficient stiffness to counteract the mechanical clamping loads applied to the IC device on top of the printed circuit board. In the absence of such a stiffening structure, the printed circuit board can bend or deflect under the applied loads. Excessive bending or deflection of the printed circuit board may cause solder joints and components to fracture or otherwise fail and may also cause LGA sockets, which have limited operating ranges, to lose their electrical connection thereby disrupting electrical communication between the IC device and the associated printed circuit board.

Backing plates are conventionally used with single-sided LGA printed circuit boards, that is, boards carrying LGA IC devices on only one of their major surfaces as exemplified by U.S. Pat. No. 6,198,630 to Cromwell for METHOD AND APPARATUS FOR ELECTRICAL AND MECHANICAL ATTACHMENT, AND ELECTROMAGNETIC INTERFERENCE AND THERMAL MANAGEMENT OF HIGH SPEED, HIGH DENSITY VLSI MODULES, assigned to the assignee of the present invention.

Printed circuit board assemblies in which high density LGA IC devices are mounted on both surfaces of the printed circuit board can present a unique problem in counteracting the substantial clamping loads that must be applied to the IC devices.

Figure 1:
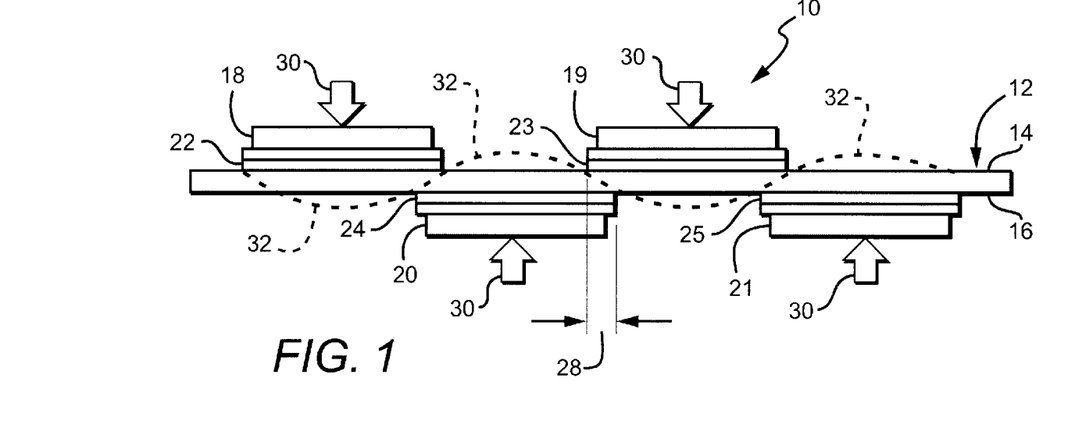
FIG. 1 is a side elevation view showing in simplified form a printed circuit board assembly comprising a double-sided printed circuit board carrying LGA IC devices on both of the major surfaces of the board.

FIG. 1 illustrates the problem. FIG. 1 shows a printed circuit board assembly 10 comprising a double-sided printed circuit board 12 having opposed upper and lower major surfaces or sides 14 and 16, respectively. The upper side 14 carries a pair of high density LGA IC devices 18 and 19 and associated LGA interposer sockets 22 and 23, respectively. Similarly, the lower side 16 carries a pair of high density LGA IC devices 20 and 21 and associated LGA interposer sockets 24 and 25, respectively. Because of the circuit routing and interconnection constraints imposed by high density IC devices, the upper IC devices 18 and 19 are offset from the lower IC devices 20 and 21. However, a small amount of overlap, indicated by the reference numeral 28, exists between the upper and lower IC devices. Because of the offset, overlapping arrangement of the. IC devices shown in FIG. 1, it is not possible to provide for each IC device a backing plate on the opposite side of the board that completely backs up the IC device so as to provide adequate stiffness while at the same time serving as a means for receiving clamping fasteners passed through the board from the side carrying the IC device. It will be seen from FIG. 1 that the offset, vertical clamping forces, represented by the arrows 30, applied to the IC devices on the opposite sides of the double-sided printed circuit board 12 can result in local bending or deflection of the printed circuit board as shown by the broken lines 32. Excessive bending or deflection can cause component failure and/or loss of contact between the IC device and the printed circuit board, as already explained.

SUMMARY OF THE INVENTION

Accordingly, there is a need to reduce the deflection of such printed circuit board assemblies so as to prevent component failure and maintain reliable electrical contact between the LGA IC devices and the printed circuit board on which they are mounted.

In accordance with one specific, exemplary embodiment of the invention, there is provided an integrated circuit device module comprising a printed circuit board having opposed sides, the printed circuit board comprising a portion carrying an area contact array on one of the sides of the printed circuit board. The module comprises an integrated circuit device having opposed, top and bottom surfaces, the bottom surface of the integrated circuit device comprising an area contact array for electrical communication with the area contact array on the printed circuit board. The module further comprises a clamping mechanism for compressively urging the area contact array on the bottom surface of the integrated circuit device into electrical communication with the area contact array on the portion of the printed circuit board, the forces applied by the clamping mechanism tending to deflect the portion of the printed circuit board and cause the area contact array on the bottom surface of the integrated circuit device to lose electrical communication with the area contact array on the integrated circuit device. A biasing structure is coupled to the printed circuit board for counteracting the forces applied by the clamping mechanism and the resulting tendency of the portion of the printed circuit board to deflect.

In accordance with another specific, exemplary embodiment of the invention, there is provided an integrated circuit device module comprising a printed circuit board having opposed sides; at least one land grid array (LGA) integrated circuit (IC) device mounted on each side of the printed circuit board, the at least one LGA IC device on one side of the printed circuit board being offset from the at least one LGA IC device on the other side of the printed circuit board but overlapping therewith; a clamping mechanism for applying a force to the at least one LGA IC device on each side of the printed circuit board to urge the at least one LGA IC device into electrical communication with an LGA portion of the corresponding side of the printed circuit board under a predetermined load, the predetermined load producing reaction forces which, in combination with the force applied to the LGA IC device, tend to deflect the LGA portion of the printed circuit board; and a biasing structure associated with the at least one LGA IC device on each side of the printed circuit board for applying to the printed circuit board forces counteracting the applied and reaction forces and the resulting tendency for the LGA portion of the printed circuit board to deflect.

BRIEF DESCRIPTION OF THE DRAWINGS

The foregoing and other objects, features and advantages of the invention will be evident to those skilled in the art from the detailed description, below, taken together with the accompanying drawings, in which.

DETAILED DESCRIPTION OF THE INVENTION

FIGS. 2–7 show a preferred embodiment of the invention comprising an LGA printed circuit board module 40 comprising a double-sided printed circuit board 42 having opposed, parallel, first and second major surfaces or sides 44 and 46, respectively, also referred to herein as the upper and lower surfaces or sides.

Figure 3:
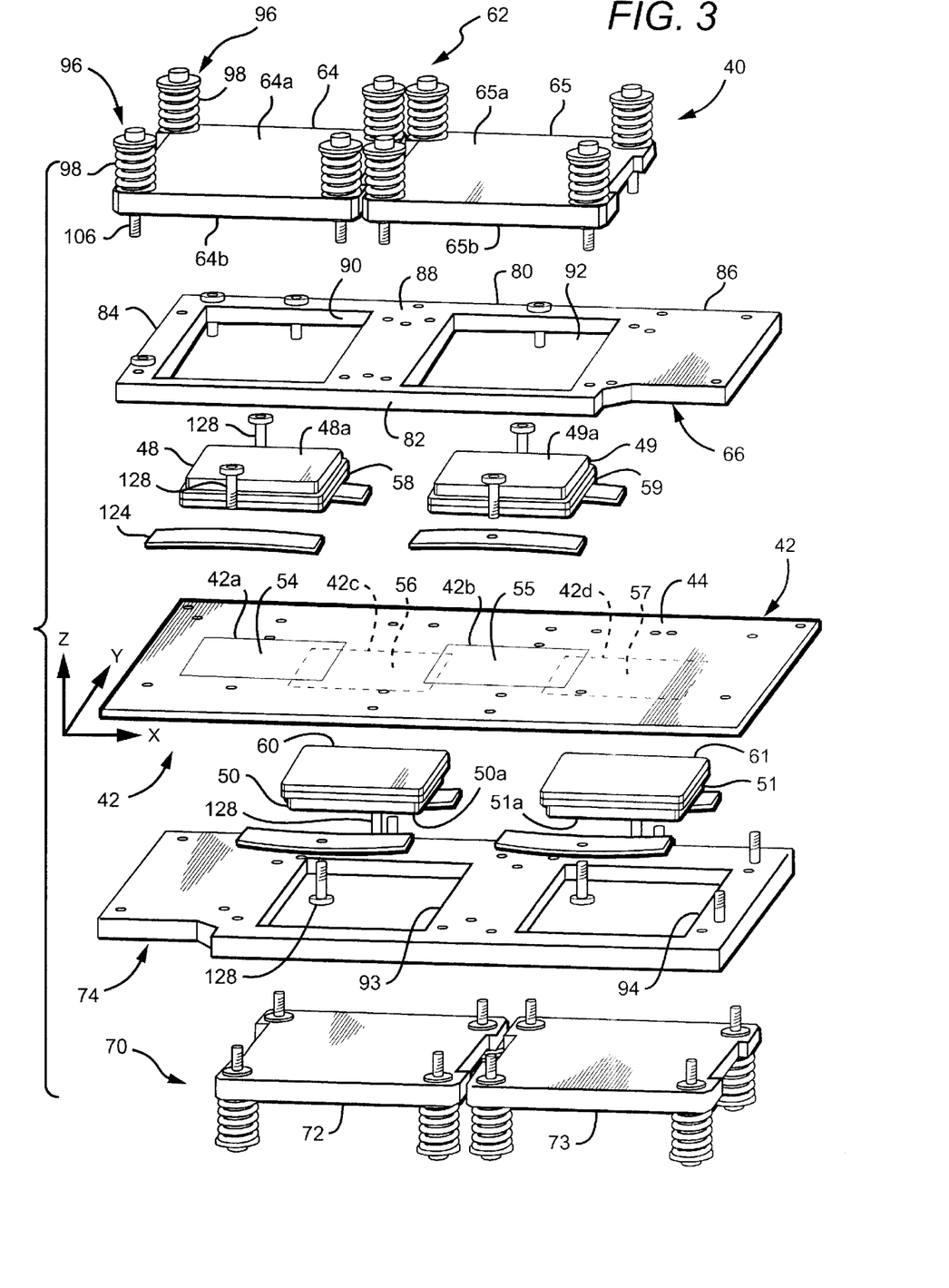
FIG. 3 is an exploded, isometric view of the double-sided printed circuit board module shown in FIG. 2.
Figure 4:
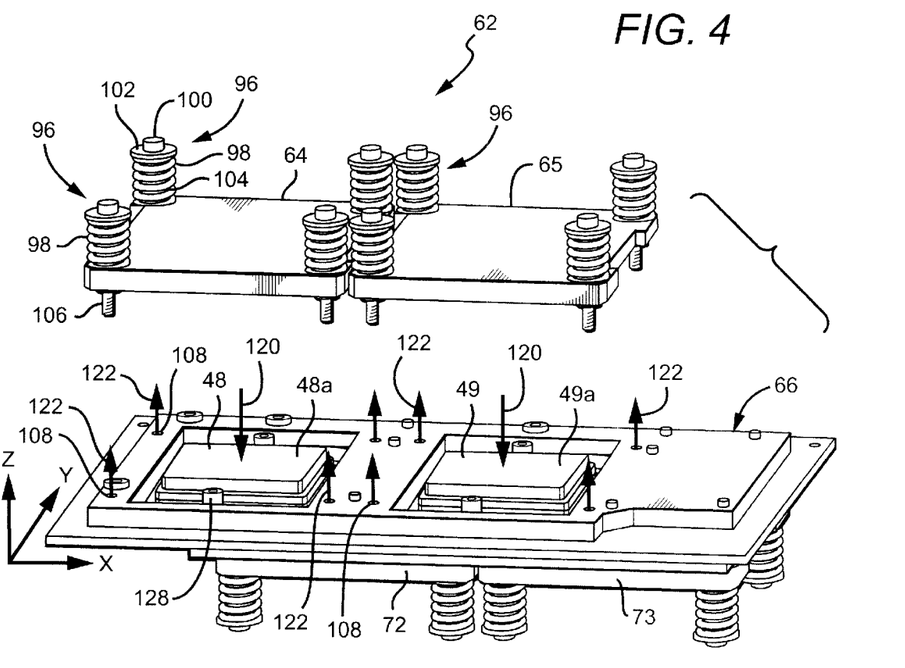
FIG. 4 is a partially exploded isometric view of the double-sided printed circuit board module in accordance with the present invention.
Figure 5:
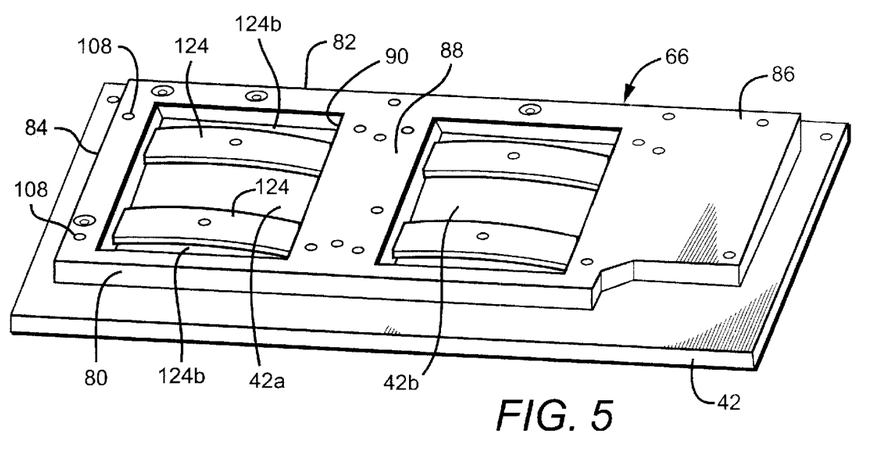
FIG. 5 is an isometric view of a portion of the double-sided printed circuit board module in accordance with a preferred embodiment of the present invention showing a biasing structure for counteracting the tendency of the printed circuit board to deflect under a clamping load, the biasing structure being in the form of leaf springs in accordance with one specific aspect of the present invention.
Figure 6:
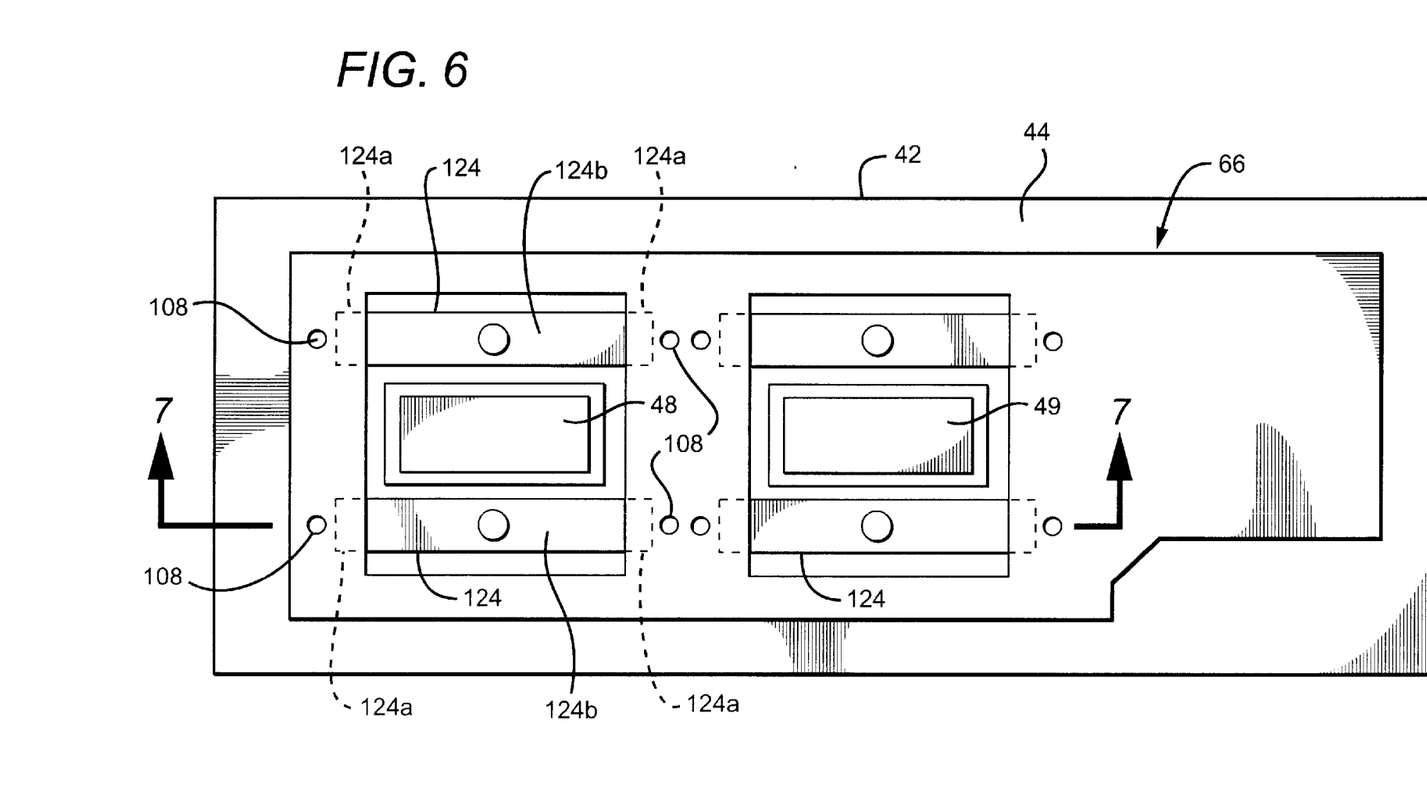
FIG. 6 is a top plan view of the double-sided printed circuit board module with the cover or clamping plates removed.

The printed circuit board 42 is a generally planar structure and for convenience may be referenced to a mutually perpendicular x, y and z coordinate system (FIGS. 3 and 4). The x and y axes denote the longitudinal and transverse directions, respectively, and define the x-y plane along which the printed circuit board 42 extends. As in the assembly of FIG. 1, the, first or upper side 44 of the printed circuit board 42 carries first and second LGA IC devices 48 and 49 (also collectively referred to herein as the upper IC devices) spaced apart along the longitudinal direction. Similarly, also as in the assembly of FIG. 1, the second or lower side 46 of the printed circuit board 42 carries third and fourth LGA IC devices 50 and 51 (also collectively referred to herein as the lower IC devices) spaced apart along the longitudinal direction of the printed circuit board 42. In the embodiment under consideration, the longitudinal spacing between the lower IC devices 50 and 51 is the same as that separating the upper IC devices 48 and 49. As in FIG. 1, the upper IC devices 48 and 49 are offset relative to the lower IC devices 50 and 51 in the longitudinal direction. Further, it will be seen that the upper IC devices 48 and 49 overlap to a small extent with the lower IC devices 50 and 51 as indicated, for example, by the reference numeral 52.

The LGA IC devices 48–51 may comprise, by way of example, very large scale integration (VSLI) integrated circuits such as CPUs in ceramic LGA packages, large gate arrays or application specific integrated circuits (ASICs). The IC devices 48–51 have top surfaces 48a–51a, respectively, and bottom surfaces 48b–51b, respectively, opposite the top surfaces. As is known, the bottom surfaces of the IC devices are provided with pads comprising electrical contacts in the form of land grid arrays. In the embodiment under consideration, all of the LGA IC devices are identical functionally and dimensionally but, as will be evident to those skilled in the art, this need not be the case.

The printed circuit board 42 comprises portions 42a and 42b carrying on the upper sides thereof pads 54 and 55 with appropriate metalization-defining contacts in the form of land grid arrays. Similarly, the printed circuit board 42 comprises portions 42c and 42d carrying on the lower side thereof land grid array pads 56 and 57.

In well known fashion, LGA interposer sockets 58–61 are sandwiched between the LGA contact pads 48c–51c on the bottom surfaces 48b–51b of the IC devices and the corresponding LGA contact pads 54–57 on the printed circuit board 42.

Associated with the upper LGA IC devices 48 and 49 and corresponding LGA interposer sockets 58 and 59 is an upper clamping or compression mechanism 62. The upper clamping mechanism 62 comprises clamping plates 64 and 65 having upper surfaces 64a and 65a and flat lower surfaces 64b and 65b engaging the top surfaces 48a and 49a of the upper IC devices 48 and 49. The upper clamping mechanism 62 further comprises an upper frame 66 overlying the upper side 44 of the printed circuit board 42.

The upper clamping mechanism 62 also comprises means 68 for coupling each of the clamping plates 64 and 65 to the upper frame 66 and for applying a predetermined compression or clamping load to the upper IC devices 48 and 49 and associated interposer sockets 58 and 59 to ensure proper loading of the contact arrays. By way of example and not limitation, the total clamping or compression load may be as high as 300 pounds for LGA interposer sockets each having 1,089 contacts. For high power IC devices, the clamping plates 64 and 65 may take the form of heat sinks, various configurations of which are well known in the art, for efficiently dissipating heat from the IC device.

The printed circuit board module 40 also comprises a lower clamping or compression mechanism 70, identical to the upper clamping mechanism 62. The lower clamping mechanism 70 comprises lower IC device clamping plates 72 and 73, a lower frame 74 and a means 76 for coupling each of the clamping plates 72 and 73 to the lower frame 74 and for applying a predetermined compression or clamping load to the lower IC devices 50 and 51 and corresponding interposer sockets 60 and 61.

The upper and lower frames 66 and 74 have identical configurations and, as best seen in FIG. 3, are arranged as mirror images of each other. Each of the frames 66 and 74 is preferably fabricated from a single plate of steel or aluminum. However, the frames can be made of other metals or of plastic or comprise a multipiece structure so long as they are sufficiently stiff to resist as much as possible any tendency of the printed circuit board 42 to deflect under the applied clamping loads.

As noted, the frames 66 and 74 are identical. Taking the upper frame 66 as representative, it comprises opposed, longitudinally extending sides 80 and 82 connected by end transverse or cross members 84 and 86 and a central transverse or cross piece 88. The central cross piece 88 is relatively wide and backs up the lower IC device 50 on the opposite surface of the printed circuit board 42. The end cross member 86 is elongated so that its enlarged surface area can function to provide substantial stiffening behind the opposite, lower IC device 51.

The longitudinal sides 80 and 82, the end cross member 84 and the cross piece 88 of the frame 66 define an opening 90 which receives the upper IC device 48. Similarly, the sides 80 and 82, the end cross member 86 and the cross piece 88 define a second opening 92, longitudinally spaced apart from the first opening 90, for receiving the upper IC device 49. In similar fashion, the frame 74 defines openings 93 and 94 receiving the lower IC devices 50 and 51, respectively.

Figure 2:
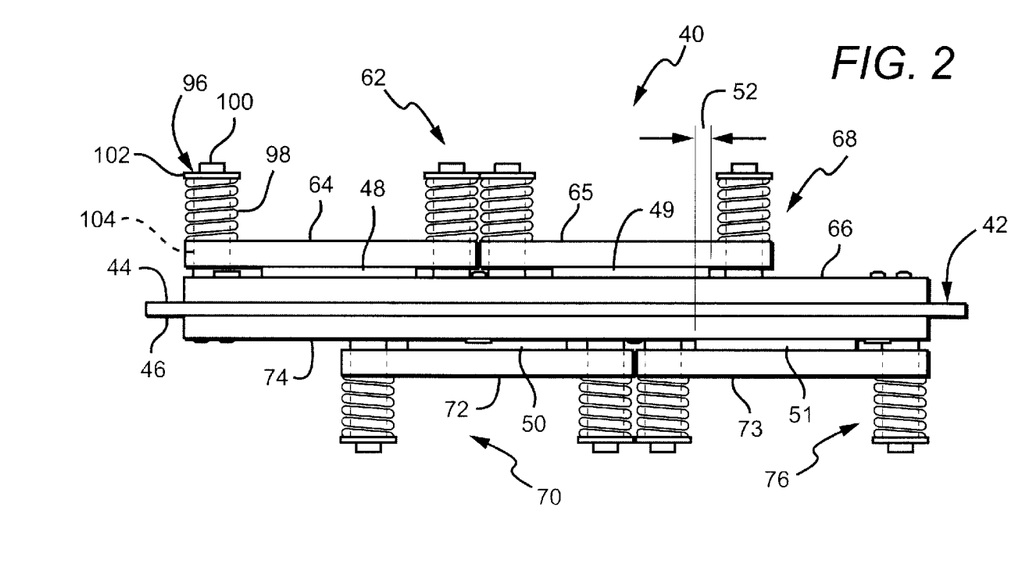
FIG. 2 is a side elevation view of a double-sided printed circuit board module in accordance with a preferred embodiment of the present invention.

As best seen in FIG. 2, each IC device has a thickness greater than that of its associated frame so that the engagement by the clamping plate of the upper surface of the IC device is unobstructed. Alternatively, the lower surface of each of the clamping plates may include a raised pedestal (not shown) to accommodate IC devices thinner than the associated frame.

Identical means for applying predetermined clamping or compression loads are provided for all of the IC devices. Taking the IC device 48 as representative, the clamping means comprises the clamping plate 64 and four identical corner fasteners 96. Each fastener 96 comprises a head 100 configured to receive a wrench, a flange 102 under the head 100, a precision machined midsection 104 and a threaded end 106. A coil spring 98 is disposed between the flange 102 of each fastener and the upper surface 64*a* of the clamping plate 64. The midsection 104 of each fastener 96 extends through an aperture formed in each of the four corners of the clamping plate 64. The threaded end 106 of each fastener is received by a threaded hole 108 in the upper frame 66. The midsection 104 of each fastener terminates at its lower end in a shoulder 110 which engages the upper surface of the frame 66 when the fastener is fully screwed into the frame. This substantially fixes the height of the compressed coil spring 98 which, in conjunction with the attributes of the spring, comprising its length and spring constant, predetermines the clamping load applied to the IC device 48 and associated interposer socket 58. It will be evident to those skilled in the art that each fastener may be fashioned so as to retain the associated coil spring in a partially compressed state to facilitate assembly of the components. Although corner fasteners and coil springs have been found to be best for controlling the applied compressive force and are preferred, other methods for controlling the clamping load will suggest themselves to those skilled in the art. For example, the coil springs may be dispensed with and reliance placed solely on the torque applied by the threaded fasteners. Alternatively, a series of stacked Belleville spring washers could be used instead of a coil spring to control the load applied by each fastener. Still further, a single central fastener carrying a coil spring or a series of stacked spring washers could be used instead of four corner fasteners.

Each of the frames 66 and 74 provides some stiffness to reduce z-axis deflections of the printed circuit board 42. In particular, because the end cross member 86 and the central cross piece 88 are relatively wide, z-axis deflections of the printed circuit board 42 along the transverse y direction are minimized. Board deflections along the longitudinal x direction, however, are significant under the imposition of the heavy clamping loads that must be applied.

The nonplanarity of the printed circuit board along the x direction results principally from the system of forces on the printed circuit board applied by the clamping hardware.

With reference to FIG. 4 and again using the IC device 48 as representative, a vertical, downwardly directed force 120 or load applied to the top surface 48*a* of the IC device 48 by the clamping plate 64 via the corner fasteners 96 produces equal and opposite vertical, upwardly directed forces 122 on the frame 66. This system of forces tends to deflect the portion 42*a* of the printed circuit board 42 under the IC device 48 downwardly, which portion comprises the LGA contact pattern on the upper side 44 of the printed circuit board. As noted, if this deflection is great enough, electrical communication between the IC device 48 and the printed circuit board 42 will be lost.

Even if the frame 66 were bolted to the opposite frame 74 through the printed circuit board, the system of applied and reaction forces would cause unacceptable board deflections for the lower side IC devices.

Figure 7:
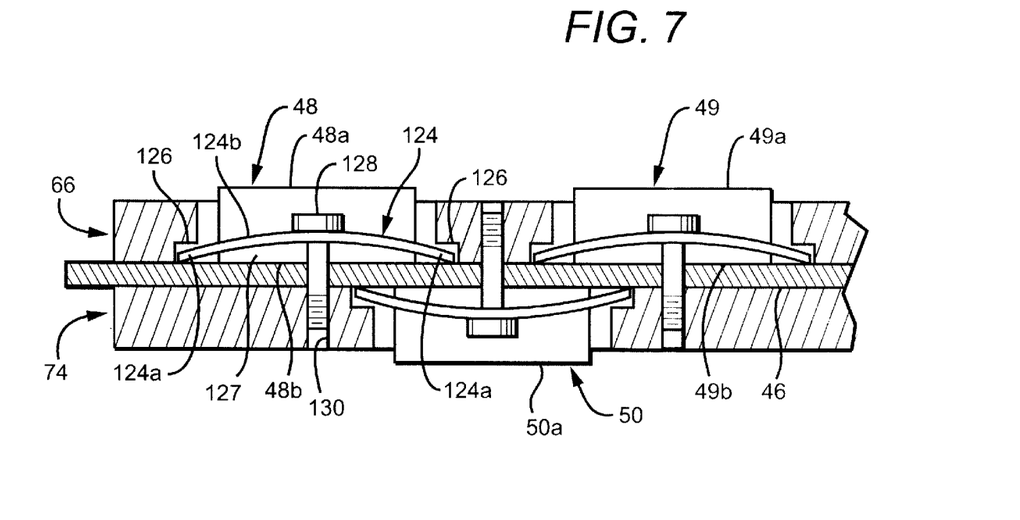
FIG. 7 is a side elevation view, in cross section, of the double-sided printed circuit module of FIG. 6 as seen along the line 7—7 in FIG. 6.

FIGS. 3–7 illustrate biasing structures for counteracting the printed circuit board deflections caused by the clamping forces. Since the biasing structure is the same for each IC device, only that associated with the upper IC device 48 will be described in detail. Disposed within the frame opening 90 between each side of the IC device 48 and the adjacent longitudinal side 80, 82 of the upper frame 66 is a longitudinally extending, elongated leaf spring 124. Thus, the leaf springs 124 within the opening 90 straddle the IC device 48. Each leaf spring 124 has opposed ends 124*a* captured within recesses 126 in the frame 66. Each of the leaf springs 124 is precurved so that each, in the relaxed state shown, for example, in FIG. 7, is arched upwardly so as to define a gap 127 between a central part 124*b* of the leaf spring and the upper side 44 of the printed circuit board 42. Each leaf spring 124 has a central aperture retaining a threaded fastener 128. The fastener 128 passes through a hole in the printed circuit board and its threaded end is received by a threaded hole 130 in the lower frame 74.

To counteract the forces applied by the clamping mechanism the fastener 128 is tightened until the center of the curved leaf spring 124 bottoms against the printed circuit board 42. The dimensions, material and curvature of the leaf spring are selected so that when the leaf spring is totally flattened, forces are applied to the printed circuit board that exactly offset the forces applied by the clamping mechanism. In essence, the leaf spring 124 transfers the force from the fastener 128 in the center of the leaf spring to the ends 124*a* of the spring, where they counteract the clamping forces on the top side 48*a* of the IC device 48.

The mechanical properties of leaf springs of the kind disclosed herein are well known and their analysis may be found in various standard treatises dealing with machine elements. By way of specific example, and not limitation, a leaf spring 124 in accordance with the present invention having a thickness of 0.072 inch, a width of 0.5 inch, a length of 3.2 inches and an initial deflection or gap 127 of 0.15 inch, requires a force of 100 lbs (50 lbs at each end 124*a*) to flatten.

Figure 8:
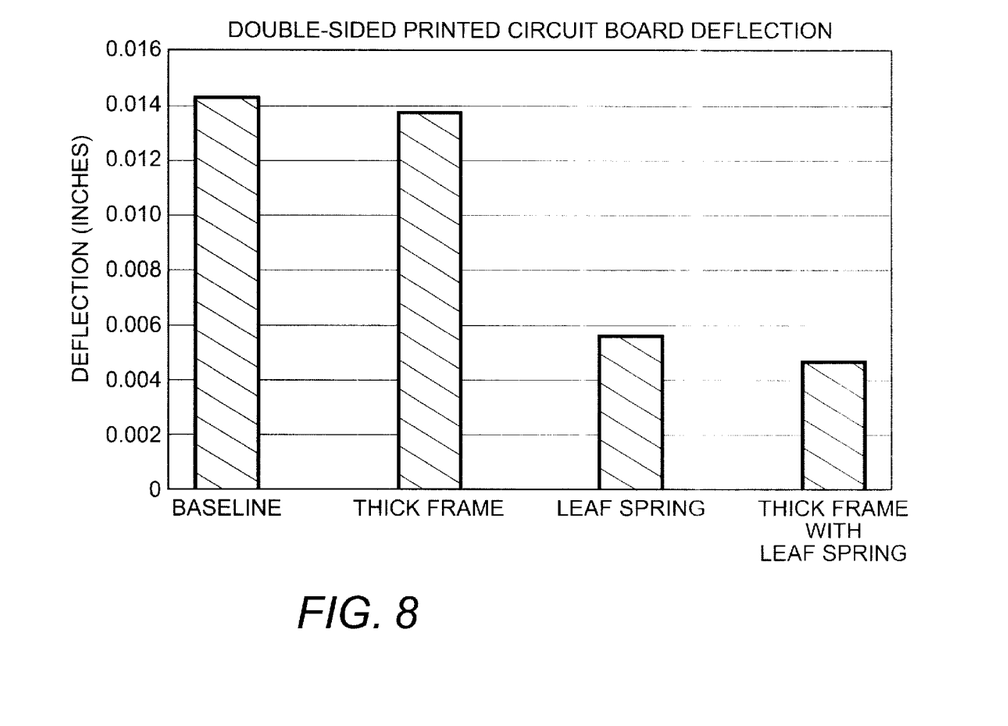
FIG. 8 is a bar graph showing double-sided printed circuit board deflections for various printed circuit board assembly constructions, showing the benefits derived from the present invention.

FIG. 8 is a bar graph showing examples of double-sided printed circuit board deflections for various constructions. It will be seen that the use of leaf springs in accordance with the present invention results in substantial reductions in printed circuit board deflections from a baseline construction, that is, a construction identical to that disclosed herein but without leaf springs. FIG. 8 also demonstrates that only small decreases in board deflection are realized using a thicker frame.

As an alternative to the use of independent leaf springs, it will be obvious that the leaf springs could be made as integral parts of the frames 66 and 74.

Further, although the invention has its greatest utility in the context of double-sided printed circuit boards carrying high density LGA components on both sides, it will be appreciated by those skilled in the art that the invention can be applied to single-sided LGA boards.

I claim:

1. An integrated circuit device module comprising:

a printed circuit board having opposed sides, said printed circuit board comprising a portion carrying an area contact array on one of the sides of the printed circuit board;

an integrated circuit device having opposed, top and bottom surfaces, said bottom surface of said integrated circuit device comprising an area contact array for electrical communication with said area contact array on said printed circuit board;

a clamping mechanism for compressively urging said area contact array on said bottom surface of said integrated circuit device into electrical communication with said area contact array on said portion of said printed circuit board, the forces applied by said clamping mechanism tending to deflect said portion of said printed circuit board and cause said area contact array on said bottom surface of said integrated circuit device to lose electrical communication with said area contact array on said integrated circuit device; and a biasing structure coupled to the printed circuit board for counteracting the forces applied by said clamping mechanism and the resulting tendency of said portion of said printed circuit board to deflect.

2. The module defined in claim 1, in which:

said clamping mechanism comprises a clamping plate engaging the top surface of the integrated circuit device.

3. The module defined in claim 2, further comprising:

a first frame overlying said one side of said printed circuit board, said frame comprising an opening receiving said integrated circuit device.

4. The module defined in claim 3, in which:

the clamping mechanism further comprises at least one fastener coupling said clamping plate and said first frame.

5. The module defined in claim 4, further comprising:

a second frame overlying the other side of the printed circuit board.

6. The module defined in claim 5, in which:

said biasing structure comprises a pair of parallel precurved leaf springs disposed within said opening in said first frame and straddling said integrated circuit device, each of said pair of leaf springs having a central portion spaced apart from said one side of said printed circuit board and ends engaging said one side, a fastener coupling said central portion of said leaf spring with said second frame, tightening of said fastener flattening said leaf spring to counteract said tendency of said portion of said of said printed circuit board to deflect.

7. An integrated circuit device module comprising:

a printed circuit board having opposed sides;

at least one land grid array (LGA) integrated circuit (IC) device mounted on each side of the printed circuit board, said at least one LGA IC device on one side of said printed circuit board being offset from said at least one LGA IC device on the other side of the printed circuit board but overlapping therewith;

a clamping mechanism for applying a force to said at least one LGA IC device on each side of the printed circuit board to urge said at least one LGA IC device into electrical communication with an LGA portion of the corresponding side of the printed circuit board under a predetermined load, said predetermined load producing reaction forces which, in combination with said force applied to said LGA IC device, tend to deflect said LGA portion of said printed circuit board; and a biasing structure associated with said at least one LGA IC device on each side of the printed circuit board for applying to said printed circuit board forces counteracting said applied and reaction forces and the resulting tendency for the LGA portion of the printed circuit board to deflect.

8. The module defined in claim 7, in which:

each of said clamping mechanisms comprises a clamping plate engaging a top surface of said at least one LGA IC device on each side of the printed circuit board.

9. The module defined in claim 8, further comprising:

a first frame overlying said one side of said printed circuit board, said first frame comprising an opening receiving said at least one LGA IC device on said one side of said printed circuit board; and a second frame overlying said other side of said printed circuit board, said second frame comprising an opening receiving said at least one LGA IC device on said other side of said printed circuit board.

10. The module defined in claim 9, in which:

said clamping mechanism on said one side of said printed circuit board comprises at least one fastener coupling the associated clamping plate with said first frame; and said clamping mechanism on said other side of said printed circuit board comprises at least one fastener coupling the associated clamping plate with said second frame.

11. The module defined in claim 10, in which:

said biasing structure on said one side of said printed circuit board comprises a first pair of parallel precurved leaf springs disposed within said opening in said first frame and straddling said at least one LGA IC device on said one side of said printed circuit board, each of said leaf springs of said first pair of leaf springs having a central portion spaced apart from said one side of said printed circuit board and ends engaging said one side, a fastener coupling said central portion of said leaf spring with said second frame, tightening of said fastener flattening said leaf spring to counteract said tendency of said portion of said of said printed circuit board to deflect; and said biasing structure on said other side of said printed circuit board comprises a second pair of parallel precurved leaf springs disposed within said opening in said second frame and straddling said at least one LGA IC device on said other side of said printed circuit board, each of said leaf springs of said second pair of leaf springs having a central portion spaced apart from said one side of said printed circuit board and ends engaging said one side, a fastener coupling said central portion of said leaf spring with said second frame, tightening of said fastener flattening said leaf spring to counteract said tendency of said portion of said of said printed circuit board to deflect.

* * * * *

UNITED STATES PATENT AND TRADEMARK OFFICE
CERTIFICATE OF CORRECTION

PATENT NO. : 6,549,418 B1
DATED : April 15, 2003
INVENTOR(S) : Jeffrey L. Deeney It is certified that error appears in the above-identified patent and that said Letters Patent is hereby corrected as shown below:

Column 7,
Line 22, delete "integrated circuit device" and insert therefor -- printed circuit board --
Line 53, after "portion" delete "of said"

Column 8,
Lines 48 and 61, after "portion" delete "of said"

Signed and Sealed this

Eleventh Day of January, 2005

JON W. DUDAS
*Director of the United States Patent and Trademark Office*